United States Patent
Lv et al.

(10) Patent No.: US 10,784,443 B2
(45) Date of Patent: Sep. 22, 2020

(54) METAL MASK PLATE WITH PLANAR STRUCTURE AND METHOD FOR MANUFACTURING THE SAME

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Shouhua Lv, Beijing (CN); Chun Chieh Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 353 days.

(21) Appl. No.: 15/575,774

(22) PCT Filed: Apr. 1, 2017

(86) PCT No.: PCT/CN2017/079318
§ 371 (c)(1),
(2) Date: Nov. 20, 2017

(87) PCT Pub. No.: WO2017/215320
PCT Pub. Date: Dec. 21, 2017

(65) Prior Publication Data
US 2018/0240976 A1 Aug. 23, 2018

(30) Foreign Application Priority Data
Jun. 12, 2016 (CN) .......................... 2016 1 0413078

(51) Int. Cl.
*C23C 14/02* (2006.01)
*H01L 51/00* (2006.01)
(Continued)

(52) U.S. Cl.
CPC ........ *H01L 51/0011* (2013.01); *C23C 14/042* (2013.01); *C23C 14/24* (2013.01); *H01L 51/001* (2013.01); *H01L 51/56* (2013.01)

(58) Field of Classification Search
CPC ... C23C 14/042; C23C 14/24; H01L 51/0011; H01L 51/001; H01L 51/56
See application file for complete search history.

(56) References Cited

U.S. PATENT DOCUMENTS 5,336,587 A * 8/1994 Tanaka ...................... G03F 1/00
430/23
5,744,284 A * 4/1998 Laub .......................... G03F 7/00
257/E21.705
(Continued)

FOREIGN PATENT DOCUMENTS

CN 1584702 A 2/2005
CN 1603951 A 4/2005
(Continued)

OTHER PUBLICATIONS

International Search Report and the Written Opinion for PCT Appl. No. PCT/CN2017/079318, dated Jul. 6, 2017, 14 pgs.
(Continued)

*Primary Examiner* — Bret P Chen
(74) *Attorney, Agent, or Firm* — Dinsmore & Shohl LLP

(57) ABSTRACT

A metal mask plate and a method for manufacturing the same are disclosed. A metal mask plate for evaporation comprises: a frame including a first side bar and a second side bar which are opposite and parallel to each other, and a support for supporting the first side bar and the second side bar; and a plurality of metal masks disposed on a first side of the frame, each of the metal masks extending in a direction which is perpendicular to a direction in which the first side bar extends, and both ends of each of the metal masks being fixed to the first side bar and the second side bar (Continued)

respectively, so that the support is deformed by a surface tension of the plurality of metal masks to form a planar structure.

10 Claims, 2 Drawing Sheets

(51) Int. Cl.
    *C23C 14/24* (2006.01)
    *C23C 14/04* (2006.01)
    *H01L 51/56* (2006.01)

(56) References Cited

U.S. PATENT DOCUMENTS

| | | | |
|---|---|---|---|
| 5,751,577 A * | 5/1998 | Sakai | G05B 19/4097 700/182 |
| 8,701,592 B2 * | 4/2014 | Ko | C23C 14/042 118/301 |
| 2004/0229415 A1 * | 11/2004 | Takehashi | H01L 29/66757 438/163 |
| 2006/0038974 A1 | 2/2006 | Sekihara | |
| 2014/0145080 A1 * | 5/2014 | Teshima | G01T 1/16 250/336.1 |
| 2014/0158046 A1 | 6/2014 | Kim | |
| 2014/0377903 A1 * | 12/2014 | Takeda | C23C 16/042 438/99 |
| 2015/0017759 A1 * | 1/2015 | Hirobe | H01L 51/0011 438/99 |
| 2015/0322562 A1 * | 11/2015 | Pan | C23C 14/042 427/272 |
| 2016/0026089 A1 * | 1/2016 | Chen | B05B 12/20 118/504 |
| 2016/0238499 A1 | 8/2016 | Ji et al. | |

FOREIGN PATENT DOCUMENTS

| | | | |
|---|---|---|---|
| CN | 1737689 A | 2/2006 | |
| CN | 203159697 U | 8/2013 | |
| CN | 103820753 A | 5/2014 | |
| CN | 104018117 A | 9/2014 | |
| CN | 104281747 A | 1/2015 | |
| CN | 104611668 A | 5/2015 | |
| CN | 106048521 A | 10/2016 | |
| JP | 2010-105207 * | 5/2010 | B41N 1/24 |
| KR | 20060058459 | 5/2006 | |
| TW | M474258 U | 3/2014 | |
| WO | WO 2014/036881 A1 | 3/2014 | |
| WO | WO 2017/185350 A1 * | 11/2017 | H01L 51/56 |

OTHER PUBLICATIONS

CN Office Action for CN Appl. No. 201610413078.5, dated Dec. 1, 2017.

* cited by examiner

METAL MASK PLATE WITH PLANAR STRUCTURE AND METHOD FOR MANUFACTURING THE SAME

CROSS-REFERENCE TO RELATED APPLICATIONS

This application is a U.S. National Stage under 35 U.S.C. § 371 of International Application No. PCT/CN2017/079318, filed on Apr. 1, 2017, which claims priority to and the benefit of Chinese application No. 201610413078.5 filed on Jun. 12, 2016 and entitled "METAL MASK PLATE AND METHOD FOR MANUFACTURING THE SAME, the disclosure of which is hereby incorporated by reference in its entirety.

TECHNICAL FIELD

The present disclosure relates to a field of display, particularly to a metal mask and method for manufacturing the same.

BACKGROUND

Currently, high-precision metal mask plates are used as molds in the process of forming films through organic evaporation for Organic Light-Emitting Diode (OLED). In the process, after being high-temperature evaporated, organic materials pass through the openings provided in the metal mask plate in molecular state and deposit onto pixel regions of a glass substrate (also, known as back-plate glass) to form an organic light emitting layer in the OLED. Generally, in order to separate individual pixel regions, a pixel defining layer having a plurality of openings is formed on the glass substrate. The pixel regions are defined by the openings of the pixel defining layer. In the evaporation, organic materials for red, green and blue pixels are evaporated through a metal mask plate ono respective pixel regions defined by the pixel defining layer, i.e., into respective openings in the pixel defining layer, respectively.

SUMMARY

The present disclosure provides a metal mask plate and a method for manufacturing the same, which can reduce a diffusion phenomenon occurred in the evaporation of organic materials, and thus the probability of the occurrence of color blending can be reduced, and the yield can be increased.

In an aspect of the present disclosure, a method for manufacturing a metal mask plate is provided, comprising: forming a frame which includes a first side bar and a second side bar opposite and parallel to each other, and a support for supporting the first side bar and the second side bar, wherein the frame protrudes toward a first side thereof along a central line between the first side bar and the second side bar and parallel to a direction in which the first side bar extends, so that the support forms an arc structure protruding toward the first side of the frame; stretching a plurality of metal masks and disposing them on the first side of the frame, each metal mask extending in a direction which is perpendicular to the direction in which the first side bar extends; and fixing both ends of each of the metal masks to the first side bar and the second side bar respectively, so that the support is deformed by a surface tension of the plurality of metal masks to form a planar structure.

In the method for manufacturing the metal mask plate according to an embodiment of the present disclosure, before fixing the metal masks to the frame ((e.g., through welding), the support of the frame is formed into an arc structure protruding toward the first side of the frame. Then, the metal masks are stretched and fixed to the first side of the frame. The support can be deformed by a surface tension of the plurality of metal masks to form a planar structure. Thus, the peripheral of the frame of the prepared metal mask plate is a planar structure. In the evaporation of organic materials using the metal mask plate, the frame can be fitted to the back-plate glass without forming a gap therebetween. With the metal mask plate prepared according to the above-mentioned method, the diffusion phenomenon of organic materials can be prevented from occurring in evaporation. Thus, the probability of the occurrence of color blending can be reduced, and the yield can be increased.

In an embodiment, the support comprises a first support plate and a second support plate, both ends of each of the first support plate and the second support plate being respectively fixed to the first side bar and the second side bar.

In an embodiment, after the planar structure is formed by the support, the direction in which the first support plate extends is perpendicular to the direction in which the first side bar extends, and the direction in which the second support plate extends is perpendicular to the direction in which the first side bar extends.

In an embodiment, the first support plate, the second support plate, the first side bar and the second side bar are formed as an integral structure.

In an embodiment, forming the frame comprises: stamping a metal plate to form the frame having the first side bar, the second side bar, the first support plate and the second support plate; and bending the formed frame to make it protrude toward a first side along the central line, so that the first support plate and the second support plate have arc structures protruding toward the first side of the frame.

In another aspect of the present disclosure, a metal mask plate that can be prepared according to any embodiments of the methods for manufacturing a metal mask plate described herein is provided. A metal mask plate is provided, comprising: a frame including a first side bar and a second side bar which are opposite and parallel to each other, and a support for supporting the first side bar and the second side bar; and a plurality of metal masks disposed on a first side of the frame, each of the metal masks extending in a direction which is perpendicular to a direction in which the first sidebar extends, and both ends of each of the metal masks being fixed to the first side bar and the second side bar respectively, so that the support is deformed by a surface tension of the plurality of metal masks to form a planar structure.

In an embodiment, the support comprises a first support plate and a second support plate, both ends of each of the first support plate and the second support plate being respectively fixed to the first side bar and the second side bar.

In an embodiment, the direction in which the first support plate extends is perpendicular to the direction in which the first side bar extends, and the direction in which the second support plate extends is perpendicular to the direction in which the first side bar extends.

In an embodiment, the first support plate, the second support plate, the first side bar, and the second side bar are formed as an integral structure.

In an embodiment, the fixing comprises welding.

BRIEF DESCRIPTION OF THE DRAWINGS

The drawings are illustrated and described herein for illustration and description of the selected embodiments, and are not intended to enumerate all possible embodiments or to limit the scope of the present application. In the drawings.

Throughout the various views of these drawings, the corresponding reference numbers represent like components or features or corresponding components or features.

DETAILED DESCRIPTION

Hereinafter, technical solutions of the embodiments of the present disclosure will be described with reference to the figures of the drawings. Evidently, these described embodiments are just parts of the embodiments of the present disclosure, are not intended to enumerate all embodiments thereof. All other embodiments that can be obtained by those with ordinary skills in the art on basis of the embodiments herein without creative efforts shall fall within the scope of the present disclosure.

To describe the technical solutions in the embodiments of the present disclosure or the related art more clearly, the accompanying drawings used in the description of the embodiments or the prior art are briefly introduced in the following. Evidently, the accompanying drawings are only some embodiments of the present disclosure, and persons of ordinary skill in the art may also obtain other drawings according to these accompanying drawings without creative efforts.

Furthermore, the words in this specification and the claims using the singular or plural form can also include the plural form or singular form thereof, unless the context clearly indicates otherwise. Thus, a term in the singular generally also include the same term in the plural. Similarly, the words "comprise", "comprising", "include", "including" and the like should be construed in inclusive sense, not in exclusive sense. Similarly, the words "include" and "or" should be construed as inclusive unless such a construing is clearly prohibited in this specification. The words "example" as used in this specification, especially when leaded by a set of terms, are merely exemplary and illustrative, and should not be considered as exclusive or exhaustive.

In the related art, generally, the metal mask plate used in organic evaporation is formed by fixing metal masks on a frame. In the process of fixing the metal masks, the metal masks are stretched and fixed to the frame (for example, through welding). However, due to the effect of surface tension of the metal masks, the frame is liable to deform. For example, the side bars of the frame that are parallel to the metal masks may be bent. When this deformed metal mask plate is used in the evaporation of organic materials, the frame of the metal mask plate cannot be smoothly fitted to the back-plate glass, resulting in a gap therebetween. In such a case, due to the present of the gap, organic materials tend to diffuse around during the evaporation process, and thus a Shadow effect may occur, also a phenomenon of color blending may occur. Thus, yield may be reduced.

A metal mask plate and a method for manufacturing the same are provided according to an embodiment of the present disclosure. The metal mask plate can be used in the process of evaporation of organic materials for OLED, and can reduce the diffusion phenomenon of organic materials, and thereby the probability of the occurrence of color blending can be reduced, and the yield can be increased.

Figure 1:
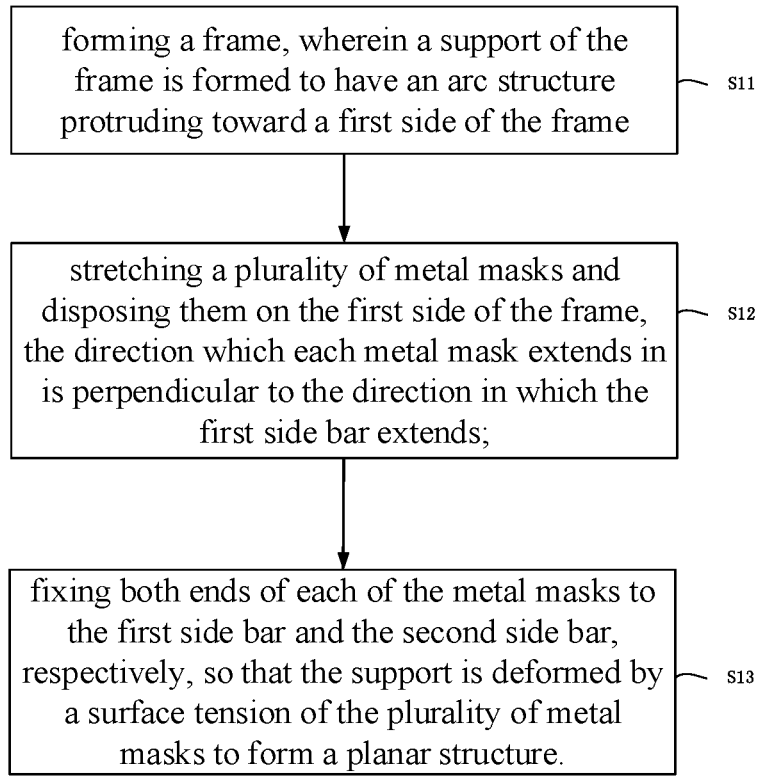
FIG. 1 is a flowchart of a method of manufacturing a metal mask plate according to an embodiment of the present disclosure.

Refer to FIGS. 1, 3, 4 and 5, a method for manufacturing a metal mask plate 1 is provided according to an embodiment of the present disclosure, and may comprises the steps S11 to S13 as shown in FIG. 1.

Figure 3:
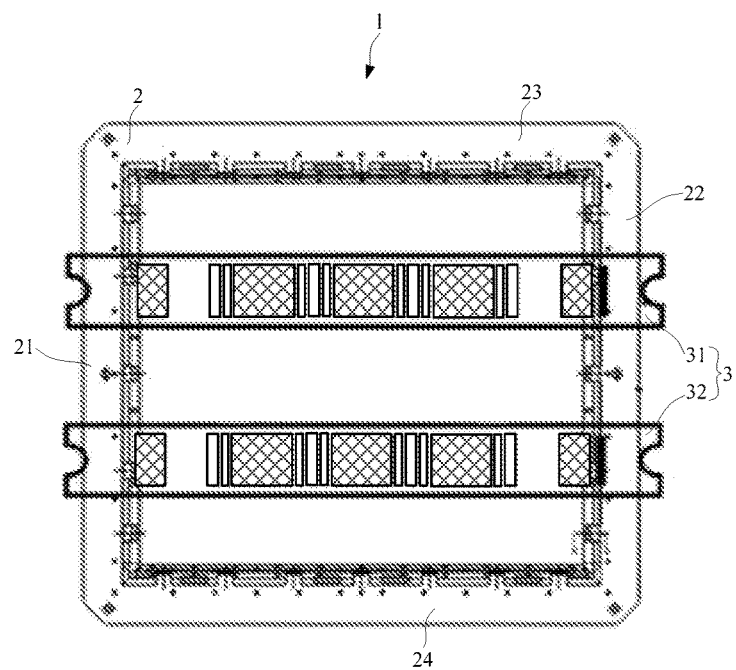
FIG. 3 is a structure diagram of a metal mask plate according to an embodiment of the present disclosure.
Figure 4:
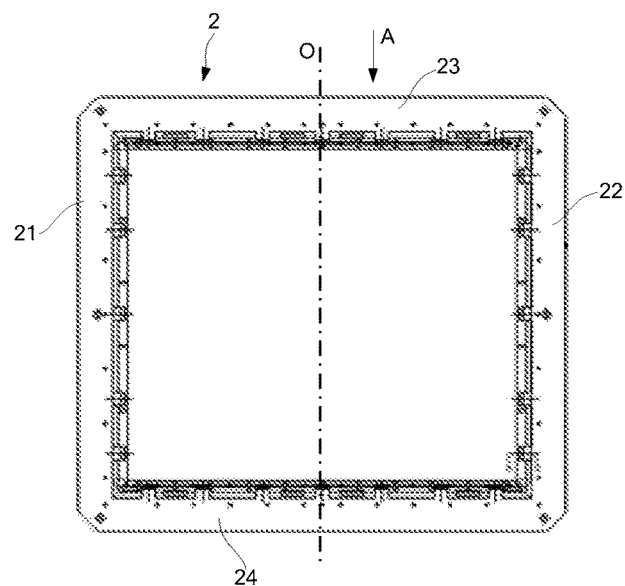
FIG. 4 is a top view of a frame of a metal mask plate according to an embodiment of the present disclosure.

At step S11, a frame 2 is formed. As shown in FIGS. 3 and 4, the formed frame 2 has a first side bar 21 and a second side bar 22 which are opposite and parallel to each other, and a support for supporting the first side bar 21 and the second side bar 22. In an example, the support may comprise a first support plate 23 and a second support plate 23 as shown in FIGS. 3 and 4. The frame 2 protrudes toward a first side B along a central line O which is parallel to the direction in which the first side bar 21 extends and which is located between the first side bar 21 and the second side bar 22, so that the support forms an arc structure protruding toward the first side B of the frame 2.

At step S12, a plurality of metal masks 3 are stretched and disposed on the first side B of the frame 2. The direction in which each metal mask 3 extends is perpendicular to the direction in which the first side bar 21 extends.

In an exemplary embodiment, as shown in FIG. 3, the plurality of metal masks 3 may comprise a first metal mask 31 and a second metal mask 32. The direction in which the first metal mask 31 extends and the direction in which the second metal mask 32 extends are both perpendicular to the direction in which the first side bar 21 extends. It is to be noted that, in the embodiments of the present disclosure, the number of the metal masks is not limited to 2 as shown in FIG. 3, and there can be more metal masks used as well.

At step S13, the both ends of each metal mask 3 are respectively fixed to the first side bar 21 and the second side bar 22, so that the support is deformed by a surface tension of the plurality of metal masks 3 to form a planar structure.

In an exemplary embodiment, the both ends of each metal mask can be welded to the first side bar 21 and the second side bar 22, respectively. It is to be noted that fixing the metal masks to the first side bar or the second side bar is not limited to welding, but can also include riveting, bolting and other types of bonding.

Figure 5:
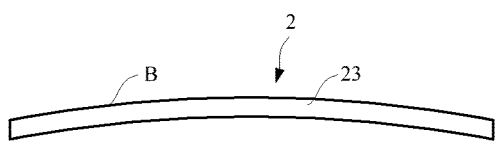
FIG. 5 is a side view in direction A of the frame shown in FIG. 4.

In the process of manufacturing the metal mask plate 1 according to the above-mentioned method, before fixing the metal masks 3 to the frame 2, the support of the frame 2 is formed into an arc structure protruding toward the first side of the frame 2. For example, as shown in FIG. 5, the first support plate 23 of the frame 2 protrudes toward the first side B of the frame. Then, the metal masks 3 are stretched and fixed (e.g., through welding) to the first side B of the frame 2, thereby the support may be deformed by a surface tension of the plurality of metal masks 3 to form a planar structure. Thus, the peripheral of the frame 2 of the prepared metal mask plate 1 is a planar structure. In the evaporation of organic materials using the metal mask plate 1, the peripheral of the frame 2 can be fitted to the back-plate glass without forming a gap therebetween. With the metal mask plate 1 prepared according to the above-mentioned method, the diffusion phenomenon of organic materials can be prevented from occurring in evaporation. Thus, the probability of the occurrence of color blending can be reduced, and the yield can be increased.

FIG. 3 shows a structure diagram of the metal mask plate 1 prepared according to the above methods. The metal mask plate 1 comprises a frame 2 and a plurality of metal masks 3. The frame 2 has a first side bar 21 and second side bar 22 which are opposite and parallel to each other, and a support for supporting the first side bar 21 and the second side bar 22. The plurality of metal mask 3 are disposed on the first side, B, of the frame 2. The direction that each metal mask 3 extends in is perpendicular to the direction in which the first side bar 21 extends. Both ends of each metal mask 3 are respectively fixed to the first side bar 21 and the second side bar 22. Thus, the support may be deformed by a surface tension of the plurality of metal masks 3 to form a planar structure.

In a specific embodiment of the present disclosure, as shown in FIGS. 3 and 4, the support of the frame 2 may comprise a first support plate 23 and a second support plate 24. Both ends of each of the first support plate 23 and the second support plate 24 are respectively fixed to the first side bar 21 and the second side bar 22.

In an exemplary embodiment of the present disclosure, as shown in FIGS. 3 and 4, after the support forms a planar structure, the direction that the first support plate 23 extends in is perpendicular to the direction in which the first side bar 21 extends, and the direction in which the second support plate 24 extends is perpendicular to the direction in which the first side bar 21 extends.

In an exemplary embodiment of the present disclosure, the first support plate 23, the second support plate 24, the first side bar 21, and the second side bar 22 are formed as an integral structure. In such a configuration, the frame 2 is an integral structure, which is advantageous to increase the structure stability of the frame 2.

Figure 2:
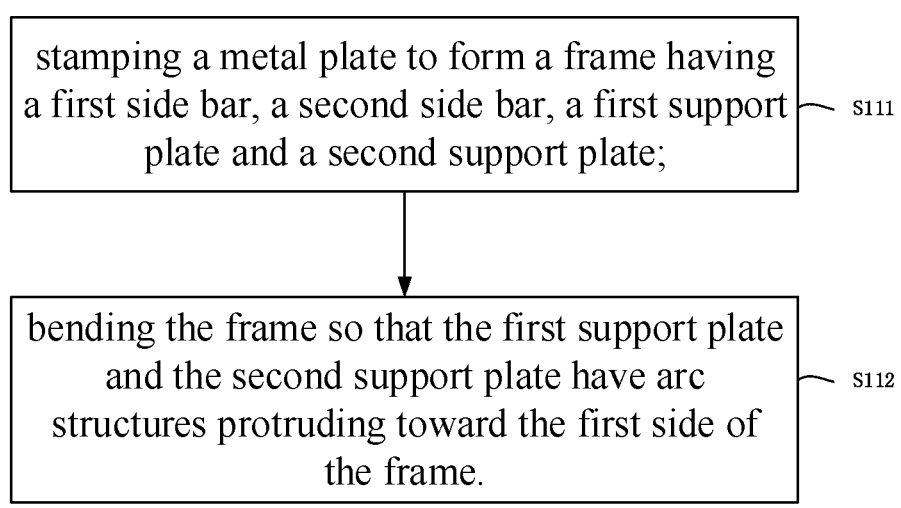
FIG. 2 is a flowchart of the step of forming a frame as shown in FIG. 1.

In an exemplary embodiment of the present disclosure, as shown in FIG. 2, the frame 2 can be formed with a method as follows.

At step S111, a metal plate is stamped to form a frame 2 having a first side bar 21, a second side bar 22, a first support plate 23 and a second support plate 24, as shown in FIG. 4.

At step S112, the frame 2 is bent so as to protrude toward a first side, B, along the central line, O, so that the first support plate 23 and the second support plate 24 each have arc structures protruding toward the first side, B, of the frame 2. FIG. 5 illustrates the arc structure of the first support plate 23.

In the process of forming the frame according to the method shown in FIG. 2, the frame 2 is formed by stamping a metal plate which fulfills the requirements for the metal mask plate 1. The frame 2 is bent so that the first support plate 23 and the second support plate 24 form arc structures protruding toward the first side, B, of the frame 2. With such a method, the frame 2 can be formed integrally. Therefore, the fabrication of the frame 2 can be simplified and rapid, which is advantageous to increase the product yield of the frame 2.

It will be apparent to those skilled in the art that various modifications and variations can be made to the embodiments of the present disclosure without departing from the spirit or scope of the present disclosure. Those modifications and variations made to the embodiments of the present disclosure falling within the scope of the claims of the present disclosure and equivalents thereof are intended to be included within the scope of the present disclosure.

What is claimed is:

1. A metal mask plate for evaporation, comprising:
a frame including a first side bar and a second side bar which are opposite and parallel to each other, and a support for supporting the first side bar and the second side bar; and
a plurality of metal masks disposed on a first side of the frame, each of the metal masks extending in a direction which is perpendicular to a direction in which the first side bar extends, and both ends of each of the metal masks being fixed to the first side bar and the second side bar respectively, so that the support is deformed by a surface tension of the plurality of metal masks to form a planar structure.

2. The metal mask plate according to claim 1, wherein the support comprises a first support plate and a second support plate, both ends of each of the first support plate and the second support plate being respectively fixed to the first side bar and the second side bar.

3. The metal mask plate according to claim 2, wherein the direction in which the first support plate extends is perpendicular to the direction in which the first side bar extends, and the direction in which the second support plate extends is perpendicular to the direction in which the first side bar extends.

4. The metal mask plate according to claim 2, wherein the first support plate, the second support plate, the first side bar, and the second side bar are formed as an integral structure.

5. The metal mask plate according to claim 1, wherein the fixing comprises welding.

6. A method for manufacturing a metal mask plate for evaporation, comprising:
forming a frame which includes a first side bar and a second side bar opposite and parallel to each other, and a support for supporting the first side bar and the second side bar,
wherein the frame protrudes toward a first side thereof along a central line between the first side bar and the second side bar and parallel to a direction in which the first side bar extends, so that the support forms an arc structure protruding toward the first side of the frame;
stretching a plurality of metal masks and disposing them on the first side of the frame, each metal mask extending in a direction which is perpendicular to the direction in which the first side bar extends; and
fixing both ends of each of the metal masks to the first side bar and the second side bar respectively, so that the support is deformed by a surface tension of the plurality of metal masks to form a planar structure.

7. The method according to claim 6, wherein the support comprises a first support plate and a second support plate, both ends of each of the first support plate and the second support plate being respectively fixed to the first side bar and the second side bar.

8. The method according to claim 7, wherein, after the planar structure is formed by the support, the direction in which the first support plate extends is perpendicular to the direction in which the first side bar extends, and the direction in which the second support plate extends is perpendicular to the direction in which the first side bar extends.

9. The method according to claim 7, wherein the first support plate, the second support plate, the first side bar and the second side bar are formed as an integral structure.

10. The method according to claim 7, wherein forming the frame comprises:
- stamping a metal plate to form the frame having the first side bar, the second side bar, the first support plate and the second support plate; and
- bending the formed frame to make it protrude toward a first side along the central line, so that the first support plate and the second support plate have arc structures protruding toward the first side of the frame.

\* \* \* \* \*